US007515081B2

(12) United States Patent
Cho et al.

(10) Patent No.: US 7,515,081 B2
(45) Date of Patent: Apr. 7, 2009

(54) HIGH RESOLUTION DIGITAL-TO-ANALOG CONVERTER

(75) Inventors: Gyu Hyeong Cho, Daejeon (KR);
Yong-Joon Jeon, Daejeon (KR);
Young-Suk Son, Hwasoong (KR); Sang Kyung Kim, Daejeon (KR); Jin Yong Jeon, Daegu (KR); Gun Ho Lee, Bucheon (KR)

(73) Assignee: Korea Advanced Institute of Science & Technology (KR)

( * ) Notice: Subject to any disclaimer, the term of this patent is extended or adjusted under 35 U.S.C. 154(b) by 0 days.

(21) Appl. No.: 11/754,431

(22) Filed: May 29, 2007

(65) Prior Publication Data

US 2007/0290911 A1 Dec. 20, 2007

(30) Foreign Application Priority Data

Jun. 14, 2006 (KR) .................. 10-2006-0053342

(51) Int. Cl.
*H03M 1/66* (2006.01)
(52) U.S. Cl. .................................. 341/144; 341/136
(58) Field of Classification Search ................. 341/144, 341/136, 135
See application file for complete search history.

(56) References Cited

U.S. PATENT DOCUMENTS

| 5,475,331 | A | * | 12/1995 | Bult et al. | .................... 327/427 |
|---|---|---|---|---|---|
| 6,703,956 | B1 | * | 3/2004 | Mueller et al. | .............. 341/145 |
| 6,747,587 | B2 | * | 6/2004 | Sekiguchi | .................... 341/153 |
| 6,812,879 | B2 | * | 11/2004 | Suwa et al. | ................. 341/144 |
| 6,906,652 | B2 | * | 6/2005 | Bugeja | ........................ 341/145 |
| 2003/0214465 | A1 | * | 11/2003 | Kimura | ........................ 345/76 |

* cited by examiner

*Primary Examiner*—Peguy JeanPierre
(74) *Attorney, Agent, or Firm*—The Belles Group, P.C.

(57) ABSTRACT

A digital-to-analog converter comprises a current supplier, a current divider dividing current supplied from the current supplier into certain amounts, an inverter outputting inverted signals of input signals and non-inverted signals, a switch controlling a flow of the current divided into the certain amounts by the current divider according to the inverted signals and the non-inverted signals, and a current output block adding up the current divided into the certain amounts according to the non-inverted signals to output an analog signal. The digital-to-analog converter can be implemented on a small chip area with desired resolution.

20 Claims, 12 Drawing Sheets

US 7,515,081 B2

HIGH RESOLUTION DIGITAL-TO-ANALOG CONVERTER

RELATED APPLICATIONS

This nonprovisional application claims priority under 35 U.S.C. §119(a) on Patent Application No. 10-2006-0053342 filed in Republic of Korea on Jun. 14, 2006, the entire contents of which are hereby incorporated by reference.

BACKGROUND

Field

This document relates to a digital-to-analog converter, and more particularly, to a digital-to-analog converter that can be implemented on a small chip area with desired resolution.

As signal processing technology has been recently improved to a great extent, development of digital signal processing systems such as high-resolution televisions (TVs), digital TVs, compact disc players (CDPs), digital camcorders, pagers, and cellular phones has been rapidly advanced. This technical advancement has led to great attention to high-speed digital-to-analog converters (DACs) that convert a digital signal processed in a digital circuit of a digital signal processing system into an analog signal.

Common types of DACs include a binary weighted DAC that gives specific weights of current, voltage or charge to binary digital signals and arrange them to obtain desired analog signals, and a thermometer code DAC implemented with a thermometer code technique.

In a binary weighted DAC, corresponding to digital signal bits from the least signal bit (LSB) to the most significant bit (MSB), the magnitude of current changes at a ratio of $2^N$ in a range from $2^{LSB}$ to $2^{MSB}$. For instance, if the resolution of 8 bits is to be implemented, 8 current sources whose current ratio ranges from $2^0$ to $2^7$ are necessary. A ratio of current values between a minimum current source and a maximum current source is 128. The magnitude of output current of a current source is generally determined as the size of a device that makes up the current source. Thus, a ratio of the transistor size between the minimum current source and the maximum current source becomes 128.

If a size ratio of devices used in a binary weighted digital-to-analog conversion is very large, a slight change in a semiconductor fabrication process may cause a severe change in characteristics of binary weighted DACs. As a result, accuracy and preciseness of the binary weighted DACs are likely to be degraded.

Since a size ratio of devices making up a binary weighted DAC is often large, a required chip area for implementing the binary weighted DAC on a semiconductor chip may also increase.

A segmented binary weighted DAC is suggested to overcome the aforementioned limitations.

FIG. 1 illustrates a conventional segmented binary weighted DAC.

As illustrated, the conventional segmented binary weighted DAC is configured with an 8-bit converter using two 4-bit converters 11 and 12 in order to reduce a device size ratio of the conventional binary weighted DAC.

A ratio of current values between a minimum current source and a maximum current source decreases to 8. Thus, the size of a transistor making up the maximum current source is 8 times larger than the size of a transistor making up the minimum current source. As a result, the device size ratio decreases, so that the sensitivity of a characteristic change to a fabrication process change can be reduced.

However, if the total number of bits increases to 10, the above suggested segmented binary weighted DAC is configured with a 10-bit converter using two 5-bit converters. Thus, a size ratio of the devices making up the current sources increases to 16. The device size ratio may increase in proportion to the total number of bits.

FIG. 2 illustrates a conventional segmented thermometer code DAC.

As illustrated, the conventional segmented thermometer code DAC is implemented with a converter having an 8-bit resolution through segmentation.

Different from the conventional binary weighted DAC, the thermometer code DAC uses $2^{N-1}$ number of current sources having the same size in order to implement an N-bit resolution. Thus, transistors used for the current sources have the same size. This result allows reduction of the sensitivity of the characteristic change to the process change, which is usually observed in the conventional binary weighted DAC.

However, the thermometer code DAC often requires an additional circuit that can implement a binary-to-thermometer code conversion function that instruct the conversion of a digital input signal into a thermometer code. Implementing this additional circuit on a semiconductor chip is more likely to increase a chip area and induce additional current consumption for the code conversion.

SUMMARY

An aspect of this document is to provide a high-resolution digital-to-analog converter (DAC).

Another aspect of the present invention is to provide a DAC that can be implemented on a small chip area.

Another aspect of the present invention is to provide a DAC that can reduce sensitivity of a change in a characteristic to a change in a semiconductor fabrication process, so as to improve operational stability.

In an aspect, a digital-to-analog converter comprises a current supplier, a current divider dividing current supplied from the current supplier, an inverter outputting inverted signals and non-inverted signals of input signals, a switch controlling a flow of the divided current by the current divider according to the inverted signals and the non-inverted signals, and a current output block adding up the divided current according to the non-inverted signals to output an analog signal.

The digital-to-analog converter may further comprise a bias block supplying a bias voltage to make the current divider operate at a saturation region.

The current supplier may be configured in a current mirror comprising one current source.

The current divider may comprise M number of unit current dividers, where M is a positive integer, the unit current dividers each comprising two N-channel transistors having commonly coupled source terminal and substantially the same channel size.

Drain terminal of one of the two N-channel transistors of the Lth unit current divider may be commonly coupled to source terminal of the two N-channel transistors of the L+1th unit current divider, where L is a positive integer equal to or less than M−1.

The switch may comprise M number of unit switches controlling supply of M number of divided current outputted from the M number of the unit current dividers.

The unit switches each may comprise two N-channel transistors having commonly coupled source terminal. One of the non-inverted signals may be inputted to a gate of one of the two N-channel transistors, and one of the inverted signals may be inputted to a gate of the other N-channel transistor.

The unit switches each may comprise two P-channel transistors having commonly coupled drain terminal. One of the non-inverted signals may be inputted to a gate of one of the two P-channel transistors, and one of the inverted signals may be inputted to a gate of the other P-channel transistor.

The digital-to-analog converter may further comprise an impedance buffer coupled between the current divider and the switch.

The impedance buffer may comprise M number of unit impedance buffers coupled respectively between the M number of the unit current dividers and the M number of the unit switches. The unit impedance buffers each may comprise one N-channel transistor or two N-channel transistors cascode-connected.

The current output block may comprise a current mirror adding up the divided current according to the non-inverted signals to output the analog signal, and a diode-connected transistor providing a current path of the divided current according to the inverted signals.

In another aspect, a digital-to-analog converter comprises a current supplier, a current divider dividing current supplied from the current supplier, an inverter outputting inverted signals and non-inverted signals of input signals, a switch controlling a flow of the divided current by the current divider according to the inverted signals and the non-inverted signals, and a current output block adding up the divided current according to the inverted signal to output an analog signal.

The digital-to-analog converter may further comprise a bias block supplying a bias voltage to make the current divider operate at a saturation region.

The current supplier may be configured in a current mirror comprising one current source.

The current divider may comprise M number of unit current dividers, where M is a positive integer. The unit current dividers each may comprise two P-channel transistors having commonly coupled source terminal and substantially the same channel size.

Drain terminal of one of the two P-channel transistors of the Lth unit current divider may be commonly coupled to source terminal of the two P-channel transistors of the L+1th unit current divider, where L is a positive integer equal to or less than M−1.

The switch may comprise M number of unit switches controlling supply of M number of divided current outputted from the M number of the unit current dividers.

The unit switches each may comprise two P-channel transistors having commonly coupled source terminal. One of the non-inverted signals may be inputted to a gate of one of the two P-channel transistors, and one of the inverted signals may be inputted to a gate of the other P-channel transistor.

The unit switches each may comprise two N-channel transistors having commonly coupled drain terminal. One of the non-inverted signals may be inputted to a gate of one of the two N-channel transistors, and one of the inverted signals may be inputted to a gate of the other N-channel transistor.

The digital-to-analog converter may further comprise an impedance buffer coupled between the current divider and the switch.

The impedance buffer may comprise M number of unit impedance buffers coupled respectively between the M number of the unit current dividers and the M number of the unit switches. The unit impedance buffers each may comprise one P-channel transistor or two P-channel transistors cascode-connected.

The current output block may comprises a current mirror adding up the divided current according to the non-inverted signals to output the analog signal, and a diode-connected transistor providing a current path of the divided current according to the inverted signals.

BRIEF DESCRIPTION OF THE DRAWINGS

The implementation of this document will be described in detail with reference to the following drawings in which like numerals refer to like elements.

DETAILED DESCRIPTION

Hereinafter, an implementation of this document will be described in detail with reference to the attached drawings.

Figure 1:
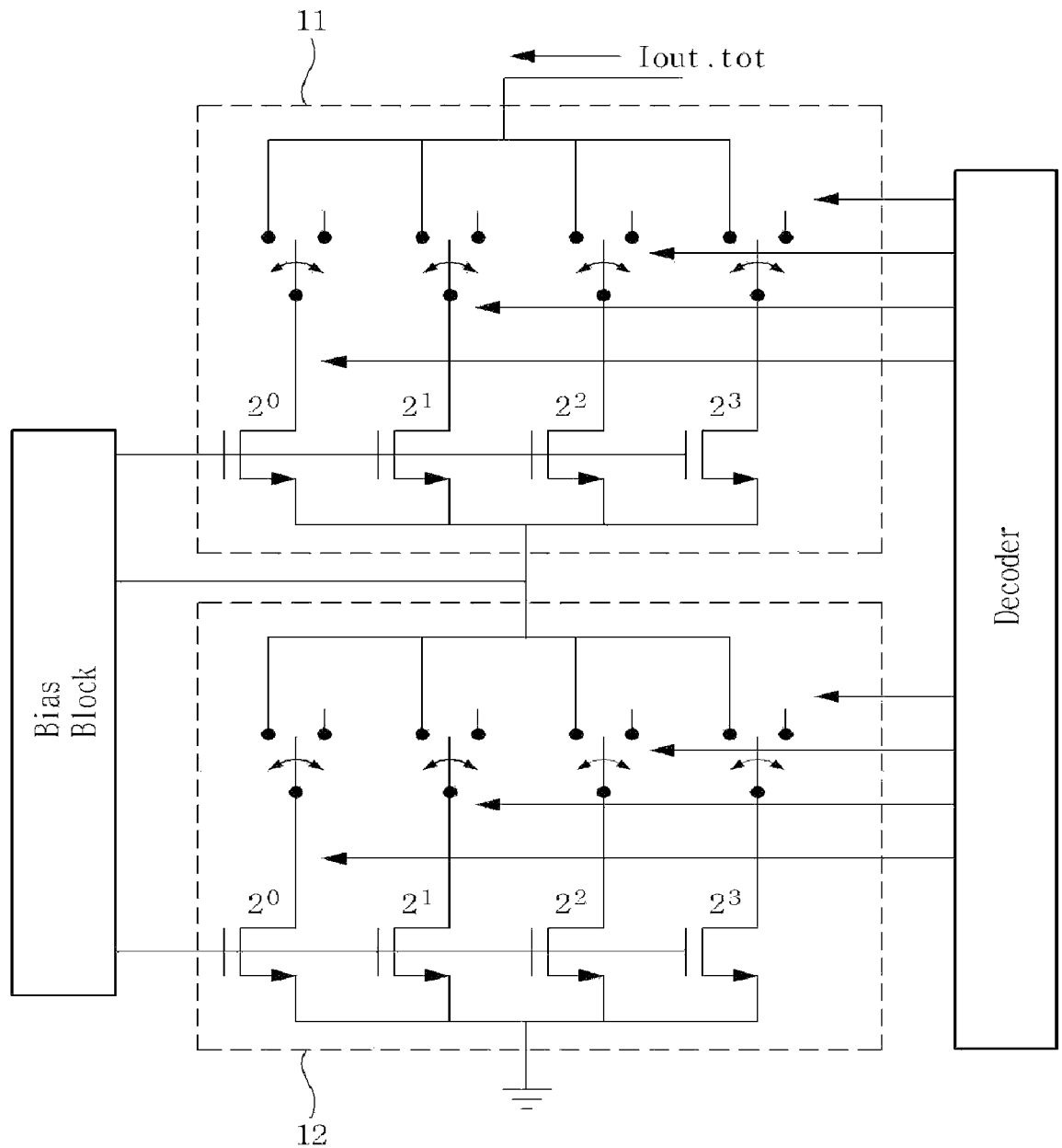
FIG. 1 illustrates a conventional segmented binary weighted digital-to-analog converter (DAC)
Figure 2:
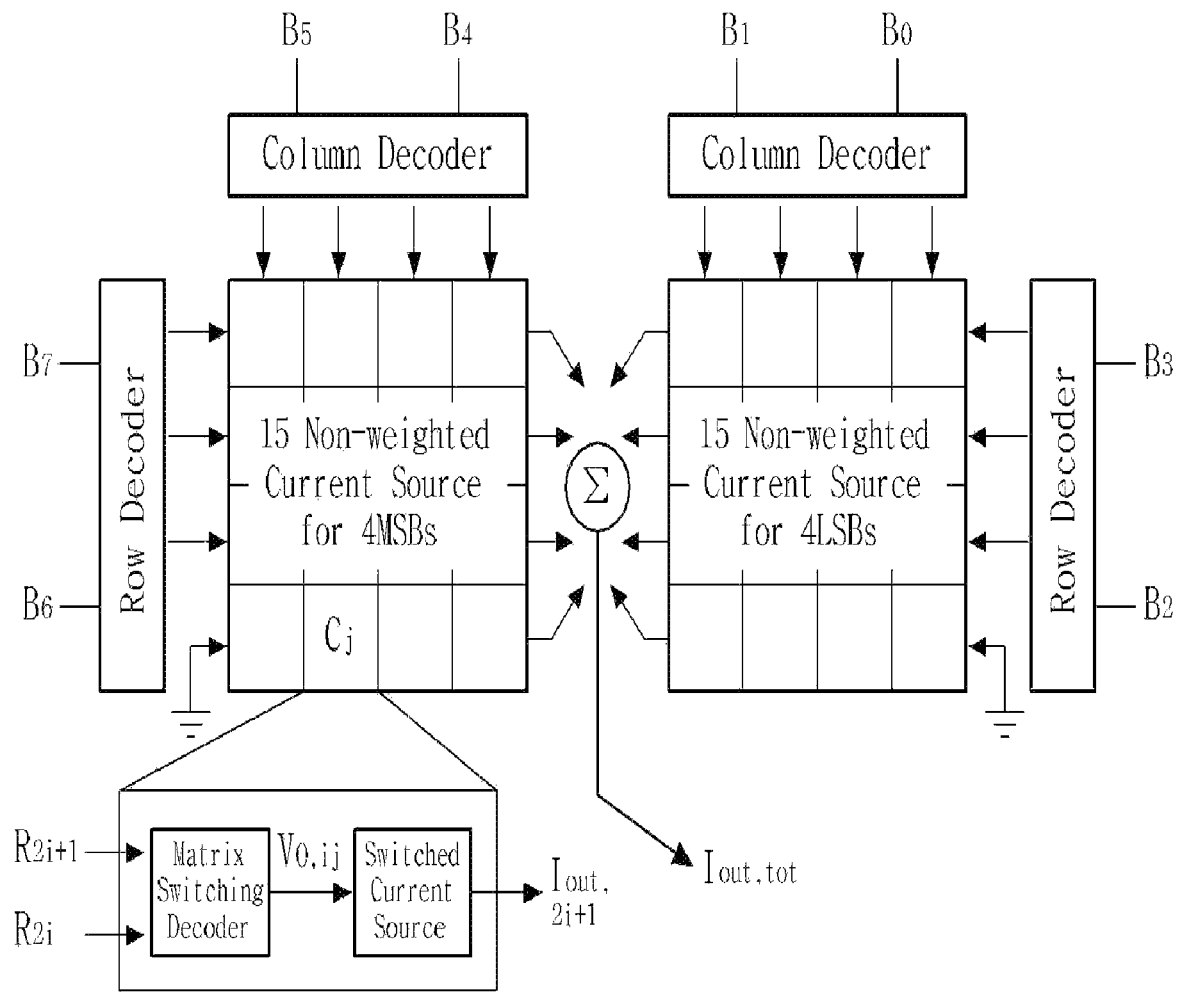
FIG. 2 illustrates a conventional segmented thermometer code DAC.
Figure 3:
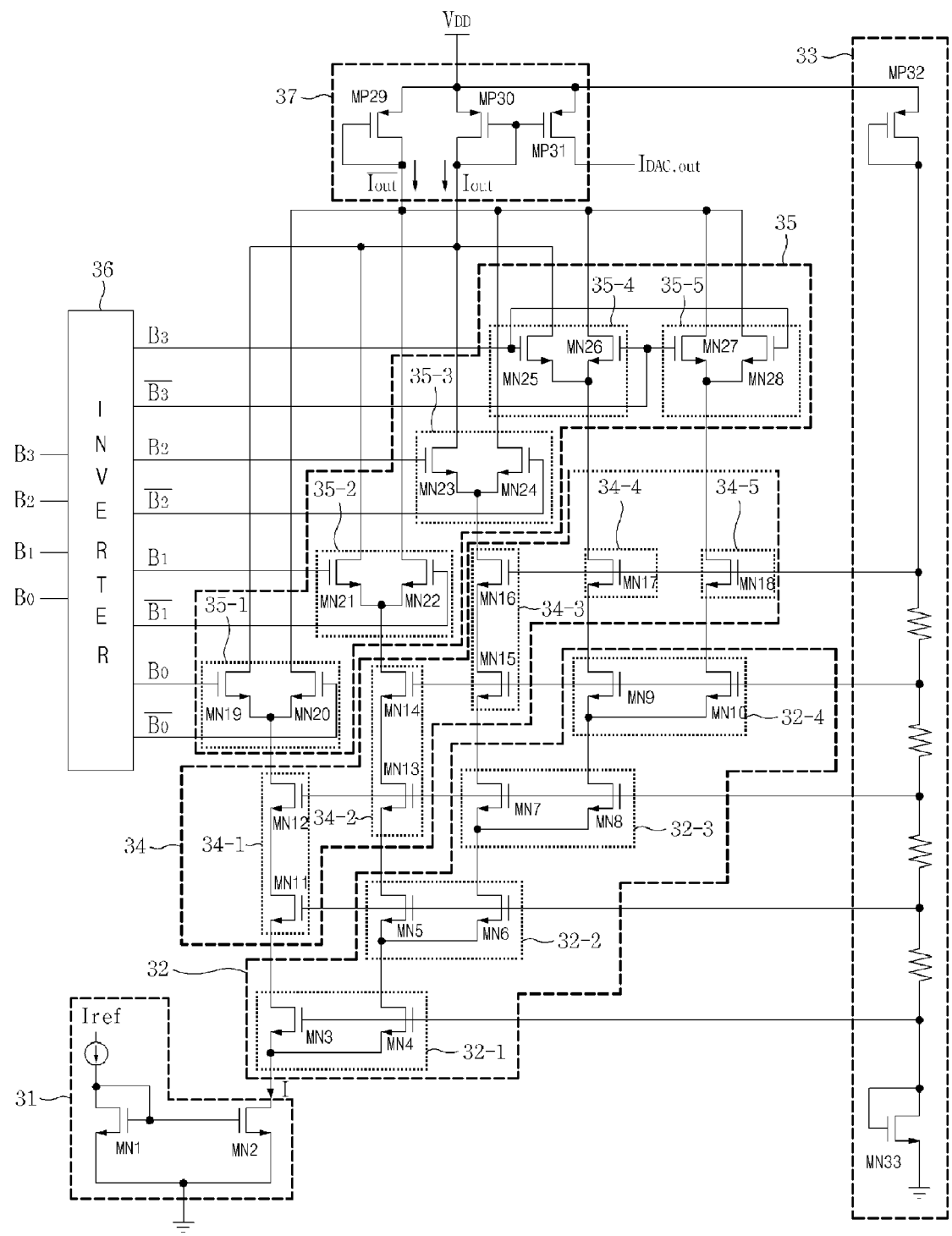
FIG. 3 illustrates a DAC according to a first embodiment of the present invention.

FIG. 3 illustrates a DAC according to a first embodiment of the present invention.

In particular, FIG. 3 illustrates one exemplary DAC used to implement a 4-bit resolution for simplicity of the description. However, the illustrated DAC is not limited to the present embodiment, and it will be apparent for those skilled in the art that the embodied circuit of the DAC can be extended to implement the resolution of 8 bits, 12 bits or more.

As illustrated, the DAC according to the first embodiment comprises a current supplier 31, a current divider 32, a bias block 33, an impedance buffer 34, a switch 35, an inverter 36, and a current output block 37.

<Current Supplier (31)>

The current supplier 31 supplies a certain amount of current corresponding to a maximum output of the DAC according to the first embodiment of the present invention to a first unit current divider 32-1 of the current divider 32, which will be described in detail later.

The current supplier 31 may be configured in a current mirror comprising one current source.

In other words, the current supplier 31 is configured with one current source Iref and two N-channel transistors MN1 and MN2 that are diode-connected together. Based on this configuration, the number of current sources required for the DAC decreases to about 1. Thus, a digital circuit used to control current sources can be simplified, and cost-effectiveness of manufacturing DACs can also be achieved.

A cascode mirror, a Wilson current mirror, a regulated cascode mirror, and a high-swing cascode mirror are other examples of the current mirror.

<Current Divider (32)>

The current divider 32 divides the current supplied from the current supplier 31.

The current divider 32 comprises first, second, third, and fourth unit current dividers 32-1, 32-2, 32-3, and 32-4. Source terminal of each of the first to fourth unit current dividers 32-1, 32-2, 32-3, and 32-4 are commonly coupled together, and the first to fourth unit current dividers 32-1, 32-2, 32-3, and 32-4 each comprise two N-channel transistors having substantially the same channel size.

For instance, in Lth and L+1th unit current dividers each comprising two N-channel transistors, where L is a positive integer less than 4, a drain terminal of one of the two N-channel transistors of the Lth unit current divider is commonly coupled to a source terminal of each of the two N-channel transistors of the L+1th unit current divider.

Operation of the current divider 32 will be described in detail below.

(1) The first unit current divider 32-1 transports about ½ amount of the current I, supplied from the current supplier 31, (i.e., I/2) to a first unit impedance buffer 34-1 of the impedance buffer 34, and the rest ½ amount of the current I to the second unit current divider 32-2.

The ½-divided current I/2 transported to the first unit impedance buffer 34-1 is transported to a first unit switch 35-1 of the switch 35. It is then determined whether or not the transported ½-divided current I/2 is to be supplied to a current output node $I_{out}$ according to a first bit value of a digital signal $B_0$ (i.e., the most significant bit (MSB) value).

(2) The second unit current divider 32-2 transports about ½ amount of the ½-divided current I/2, supplied from the first unit current divider 32-1, (i.e., I/4) to a second unit impedance buffer 34-2 of the impedance buffer 34, and the rest ½ amount of the ½-divided current I/2 to the third unit current divider 32-3.

The ¼-divided current I/4 transported to the second unit impedance buffer 34-2 is transported to a second unit switch 35-2 of the switch 35. It is then determined whether or not the transported ¼-divided current I/4 is to be supplied to the current output node $I_{out}$ according to a second bit value of a digital signal B1.

(3) The third unit current divider 32-3 transports about ½ amount of the ¼-divided current I/4, supplied from the second unit current divider 32-2, (i.e., I/8) to a third unit impedance buffer 34-3 of the impedance buffer 34, and the rest ½ amount of the ¼-divided current I/4 to the fourth unit current divider 32-4.

The ⅛-divided current I/8 transported to the third unit impedance buffer 34-3 is transported to a third unit switch 35-3 of the switch 35. It is then determined whether or not the transported ⅛-divided current I/8 is to be supplied to the current output node $I_{out}$ according to a third bit value of a digital signal $B_2$.

(4) The fourth unit current divider 32-4 transports about ½ amount of the ⅛-divided current I/8, supplied from the third unit current divider 32-3, (i.e., I/16) to a fourth unit impedance buffer 34-4 of the impedance buffer 34, and the rest ½ amount of the ⅛-divided current I/8 to a fifth unit impedance buffer 34-5.

The 1/16-divided current I/16 transported to the fourth unit impedance buffer 34-4 is transported to a fourth unit switch 35-4 of the switch 35. It is then determined whether or not the transported 1/16-divided current I/16 is to be supplied to the current output node Iout according to a fourth bit value of a digital signal $B_3$ (i.e., the least significant bit (LSB) value).

The 1/16-divided current I/16 transported to the fifth unit impedance buffer 34-5 is transported to a fifth unit switch 35-5 of the switch 35, so as to be continuously supplied to another current output node $\overline{I_{out}}$.

As described above, because each of the first to fourth unit current dividers 34-1, 34-2, 34-3, and 34-4 of the current divider 32 comprises transistors having substantially the same channel size, the DAC according to the first embodiment of the present invention can have less sensitivity of a change in a characteristic to a change in a semiconductor fabrication process than the conventional DAC that usually has a large device size ratio.

<Bias Block (33)>

The bias block 33 supplies a bias voltage to a target to allow transistors MN3 to MN18 of the current divider 32 and the impedance buffer 34 to operate at a saturation region.

<Impedance Buffer (34)>

The impedance buffer 34 is coupled between the current divider 32 and the switch 35, so as to minimize current variation caused by a switching operation of the switch 35.

The impedance buffer 34 comprises the first, second, third, and fourth unit impedance buffers 34-1, 34-2, 34-3, and 34-4 coupled between the first, second, third, and fourth unit current dividers 32-1, 32-2, 32-3, and 32-4 and the first, second, third, and fourth unit switches 35-1, 35-2, 35-3, and 35-4, respectively. As illustrated in FIG. 8, according to an embodiment of the present invention, each unit impedance buffer comprises one N-channel transistor. Alternatively, as illustrated in FIG. 7, each unit impedance buffer comprises two N-channel transistors that are cascode-connected together.

The impedance buffer 34 may further comprise the fifth unit impedance buffer 34-5 coupled between the fourth unit current divider 32-4 and the fifth unit switch 35-5.

Figure 7:
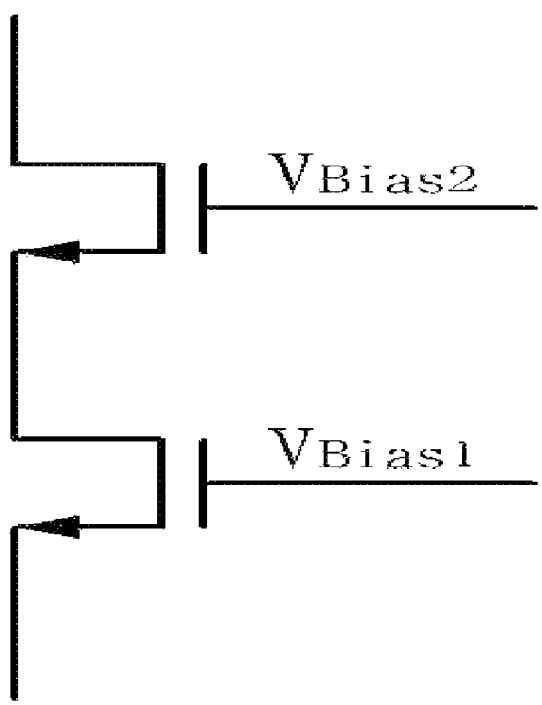
FIGS. 7 and 8 illustrate exemplary configurations of each unit impedance buffer illustrated in FIG. 3 according to an embodiment of the present invention.
Figure 8:
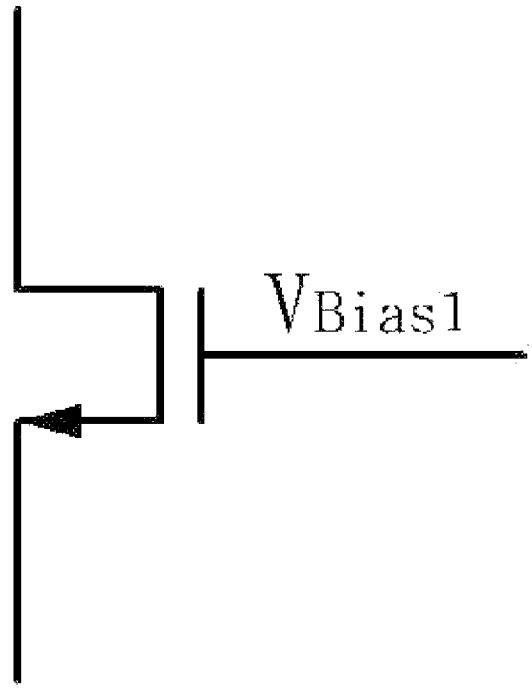
Figure 9:
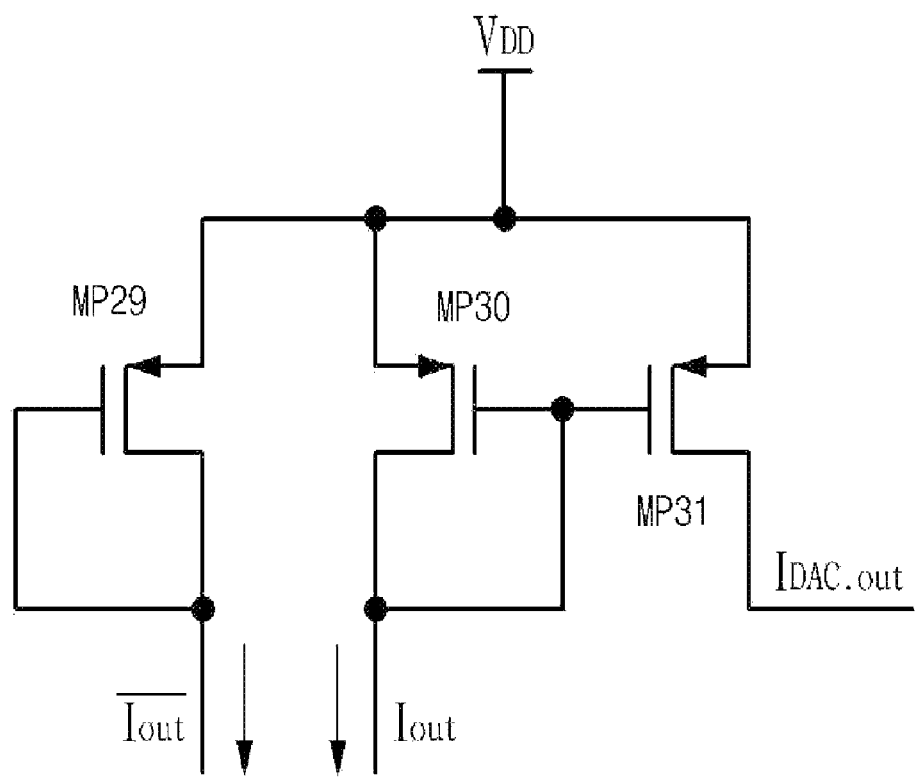
FIGS. 9 and 10 illustrate exemplary configurations of a current output block illustrated in FIG. 3 according to an embodiment of the present invention.

As illustrated in FIG. 7, the first, second, and third unit impedance buffers 34-1, 34-2, 34-3 each may comprise two N-channel transistors that are cascode-connected together. As illustrated in FIG. 8, the fourth unit impedance buffer 34-4 and the fifth unit impedance buffer 34-5 each may comprise one N-channel transistor.

<Switch (35)>

The switch 35 comprises the first, second, third, and fourth unit switches 35-1, 35-2, 35-3, and 35-4 controlling supply of the current divided into certain amounts in four stages (e.g., ½-divided current I/2, ¼-divided current I/4, ⅛-divided current I/6, and 1/16-divided current I/16) output from respective first, second, third, and fourth unit current dividers 32-1, 32-2, 32-3, and 32-4.

Figure 5:
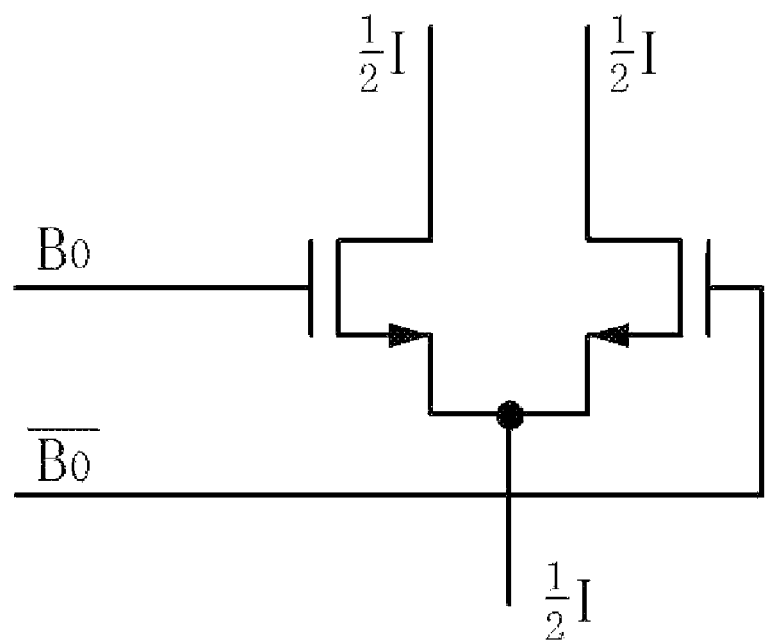
FIGS. 5 and 6 illustrate exemplary configurations of each unit switch illustrated in FIG. 3 according to an embodiment of the present invention.

According to an embodiment of the present invention, as illustrated in FIG. 5, each unit switch may comprise two N-channel transistors having commonly coupled source terminal. A non-inverted signal $B_0$ is inputted to a gate of one of the two N-channel transistors, and an inverted signal $\overline{B_0}$ is inputted to a gate of the other N-channel transistor.

Figure 6:
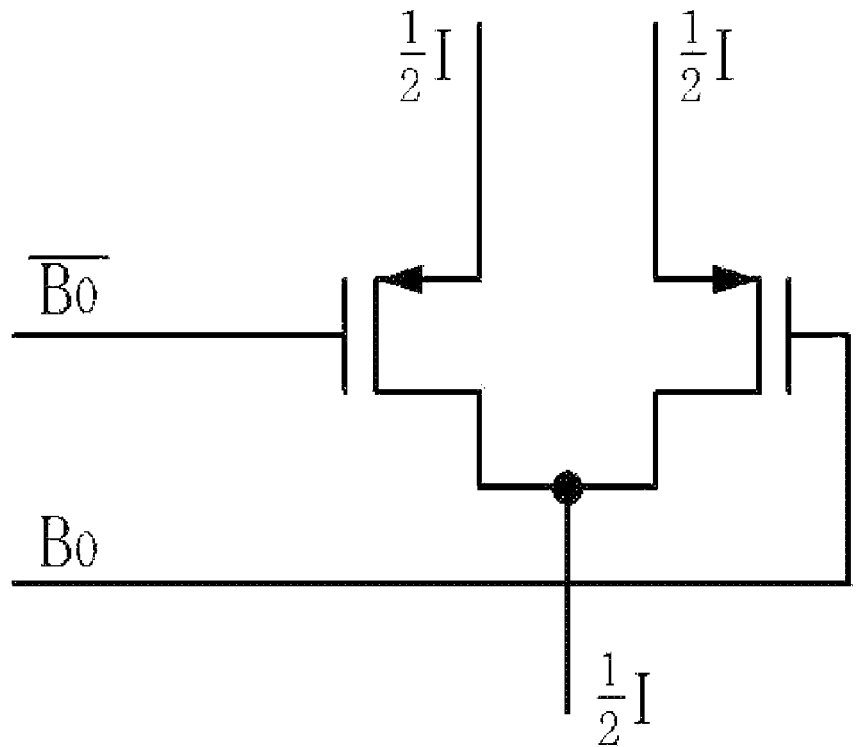

Alternatively, as illustrated in FIG. 6, each unit switch may comprise two P-channel transistors having commonly coupled drain terminal. A non-inverted signal $B_0$ is inputted to a gate of one of the two P-channel transistors, and an inverted signal $\overline{B_0}$ is inputted to a gate of the other P-channel transistor.

<Inverter (36)>

The inverter 36 outputs inverted signals in which the bits of the digital input signals $B_0$, $B_1$, $B_2$, and $B_3$ and non-inverted signals (i.e., the original digital input signals $B_0$, $B_1$, $B_2$, and $B_3$).

Figure 4:
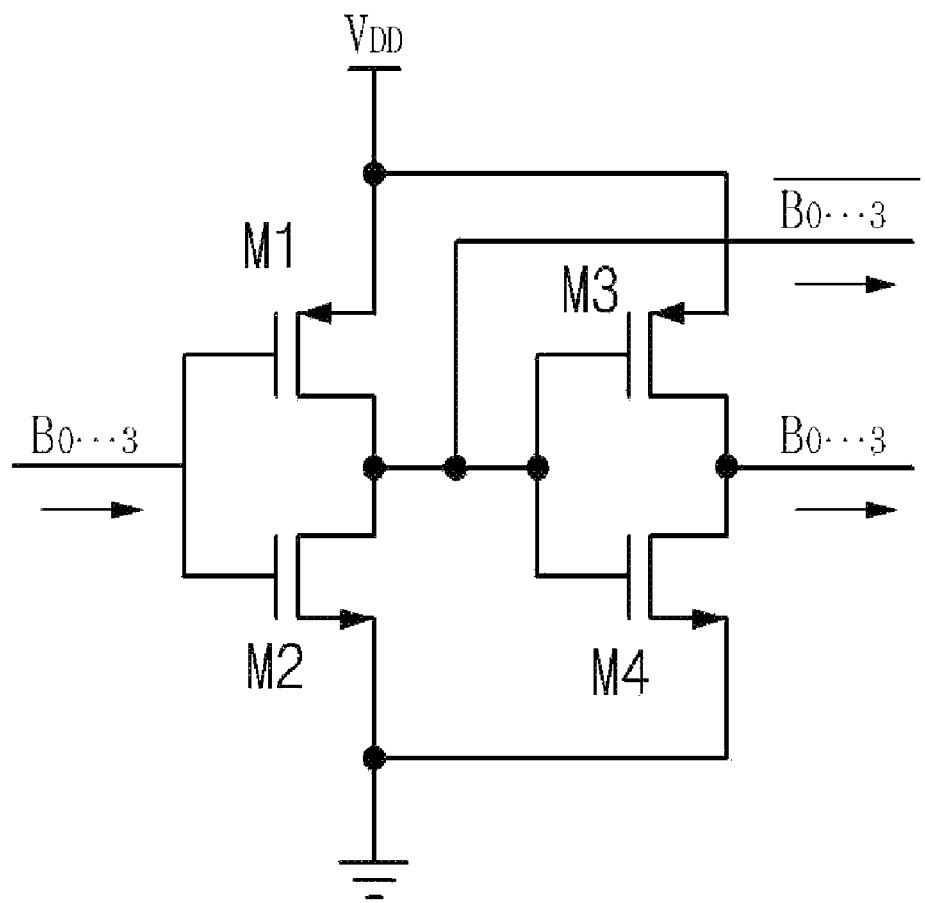
FIG. 4 illustrates an exemplary configuration of an inverter illustrated in FIG. 3 according to an embodiment of the present invention.

FIG. 4 illustrates one configuration of the inverter 36 according to an embodiment of the present invention.

As illustrated, the inverter 36 comprises first, second, third, and fourth transistors M1, M2, M3, and M4. The first and third transistors M1 and M3 are P-channel transistors, and the second and fourth transistors M2 and M4 are N-channel transistors. One terminal (e.g., source) of the first transistor M1 is coupled to a first voltage source $V_{DD}$ having a logically high level. One terminal (e.g., source) of the second transistor M2 is coupled to a second voltage source GND having a logically low level. Another terminal (e.g., drain) of the second transistor M2 is coupled to another terminal (e.g., drain) of the first transistor M1, and gates of the first and second transistors M1 and M2 are commonly coupled together. One terminal (e.g., source) of the third transistor M3 is coupled to the first voltage source $V_{DD}$, and one terminal (e.g., source) of the fourth transistor M4 is coupled to the second voltage source GND. Gates of the third and fourth transistors M3 and M4 are commonly coupled to the other terminals of the first and second transistors M1 and M2. Other terminals (e.g., drains) of the third and fourth transistors M3 and M4 are commonly coupled together.

The digital signals $B_0$, $B_1$, $B_2$, and $B_3$ are input to the gates of the first and second transistors M1 and M2, and inverted signals $\overline{B_0}$, $\overline{B_1}$, $\overline{B_2}$, and $\overline{B_3}$ are output to the gates of the third and fourth transistors M3 and M4 and to the other terminals of the first and second transistors M1 and M2. The non-inverted signals $B_0$, $B_1$, $B_2$, and $B_3$ are output to the other terminals of the third and fourth transistors M3 and M4.

<Current Output Block (37)>

The current output block 37 comprises a current mirror MP30 and MP31, and a diode-connected transistor MP29. The current mirror MP30 and MP31 adds up the divided current $I_{out}$ according to the non-inverted signals $B_0$, $B_1$, $B_2$, and $B_3$ to output an analog signal $I_{DAC.out}$. The diode-connected transistor MP29 provides a current path of the divided current $\overline{I_{out}}$ according to the inverted signals $\overline{B_0}$, $\overline{B_1}$, $\overline{B_2}$, and $\overline{B_3}$.

Other examples of the above current mirror MP30 and MP31 may comprise a cascode mirror, a Wilson current mirror, a regulated cascode mirror, and a high-swing cascode mirror.

The transistors of the current output block 37 may comprise P-channel transistors.

Figure 10:
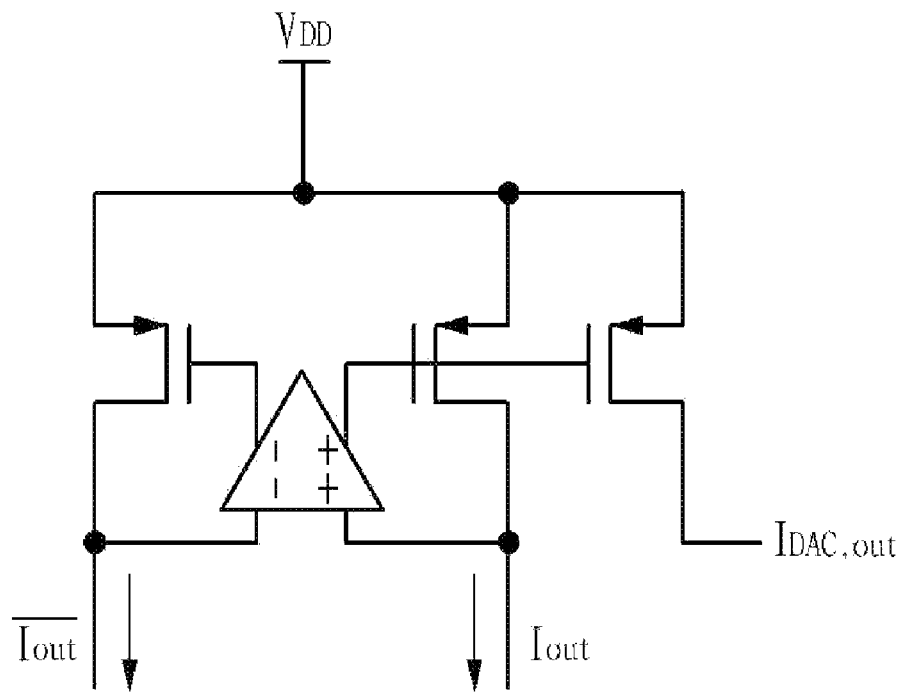
Figure 11:
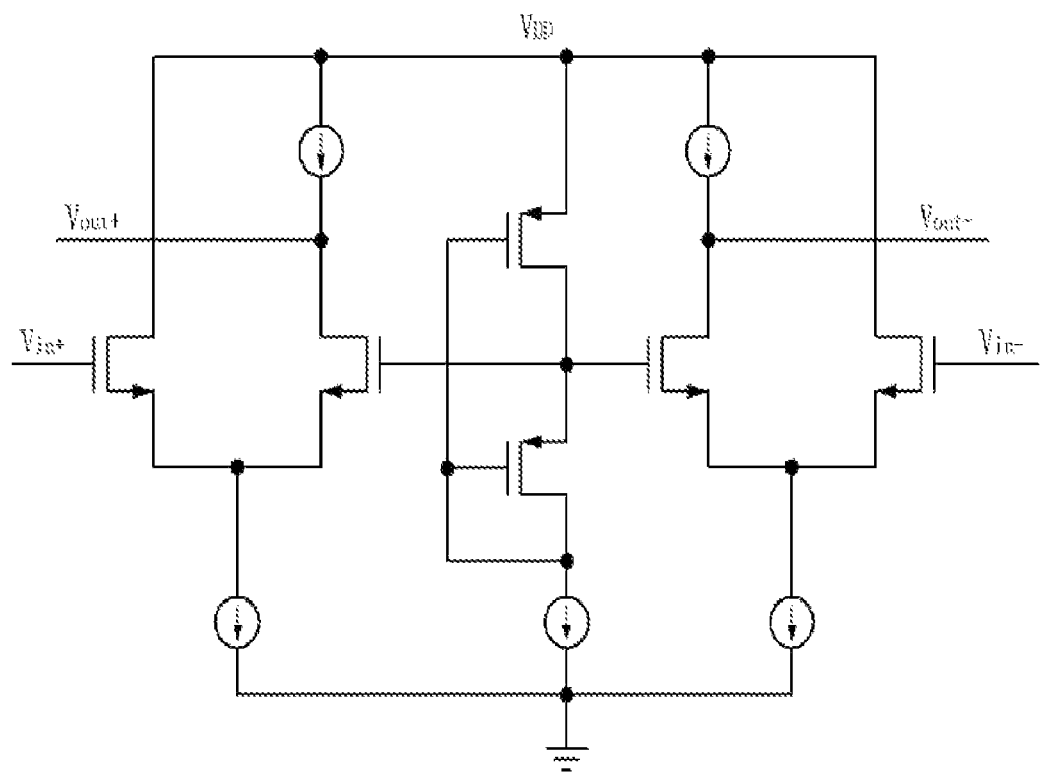
FIG. 11 illustrates a differential amplifier of the current output block illustrated in FIG. 10.

As illustrated in FIGS. 10 and 11, the current output block 37 may comprise a differential amplifier. In other words, an inter-terminal voltage between transistors that construct a current mirror illustrated in FIG. 10 can be minimized using the differential amplifier. The resultant redundant voltage obtained from the above inter-terminal voltage minimization can be divided and provided into other functional blocks stacked over each other, thereby allowing the DAC to operate at low voltage.

Figure 12:
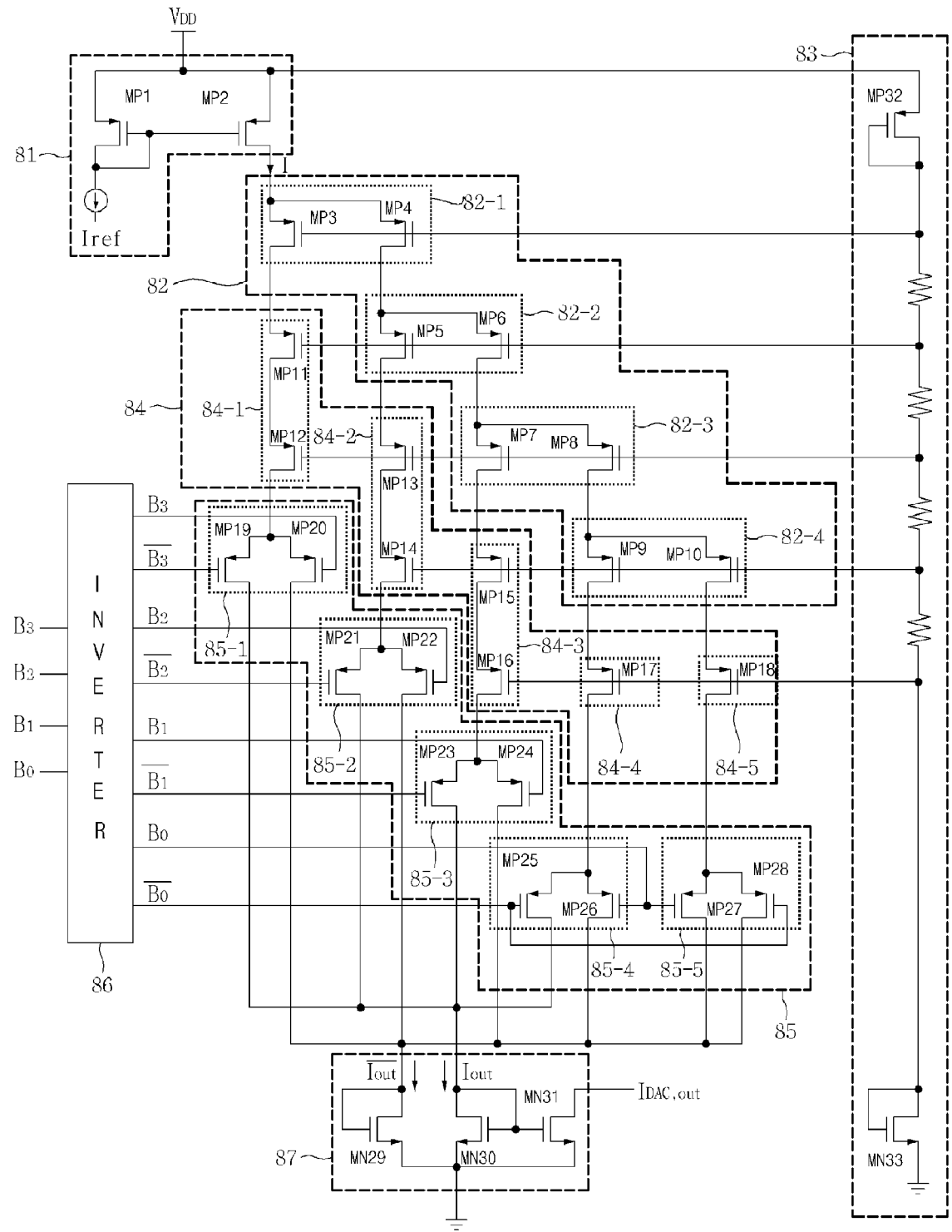
FIG. 12 illustrates a DAC according to a second embodiment of the present invention.

FIG. 12 illustrates a DAC according to a second embodiment of the present invention.

As illustrated, the DAC according to the second embodiment of the present invention comprises a current supplier 81, a current divider 82, an inverter 86, a switch 85, a current output block 87, a bias block 83, and an impedance buffer 84. The current divider 82 divides current supplied from the current supplier 81. The inverter 86 outputs inverted signals and non-inverted signals of input signals. The switch 85 controls a flow of the divided current by the current divider 82, according to the inverted signals and the non-inverted signals. The current output block 87 adds up the divided current according to the inverted signals to output an analog signal. The bias block supplies a bias voltage to make the current divider 82 operate at a saturation region.

The DAC according to the second embodiment of the present invention operates similar to the DAC according to the first embodiment of the present invention. Thus, detailed description of the DAC according to the second embodiment of the present invention will be replaced with the above provided description of the DAC according to the first embodiment of the present invention.

One difference of the second embodiment from the first embodiment lies in that the current output block 87 is configured with N-channel transistors, and other blocks such as the current supplier 81, the current divider 82, the inverter 86, and the impedance buffer 84 are configured with P-channel transistors.

Figure 15:
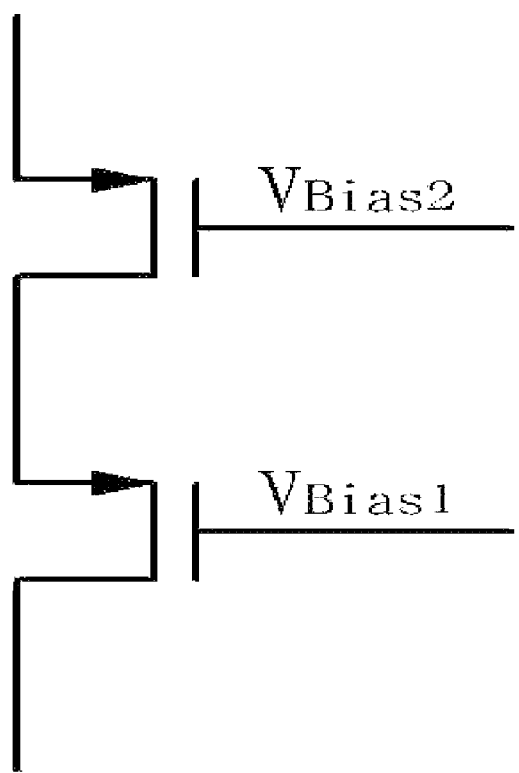
FIGS. 15 and 16 illustrate exemplary configurations of am impedance buffer illustrated in FIG. 12 according to an embodiment of the present invention.
Figure 16:
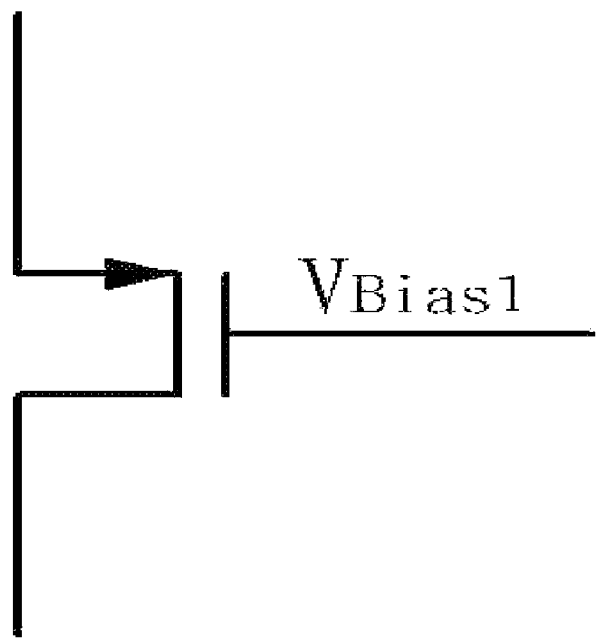

Exemplary configurations of the impedance buffer 84 using P-channel transistors are illustrated in FIGS. 15 and 16.

Figure 13:
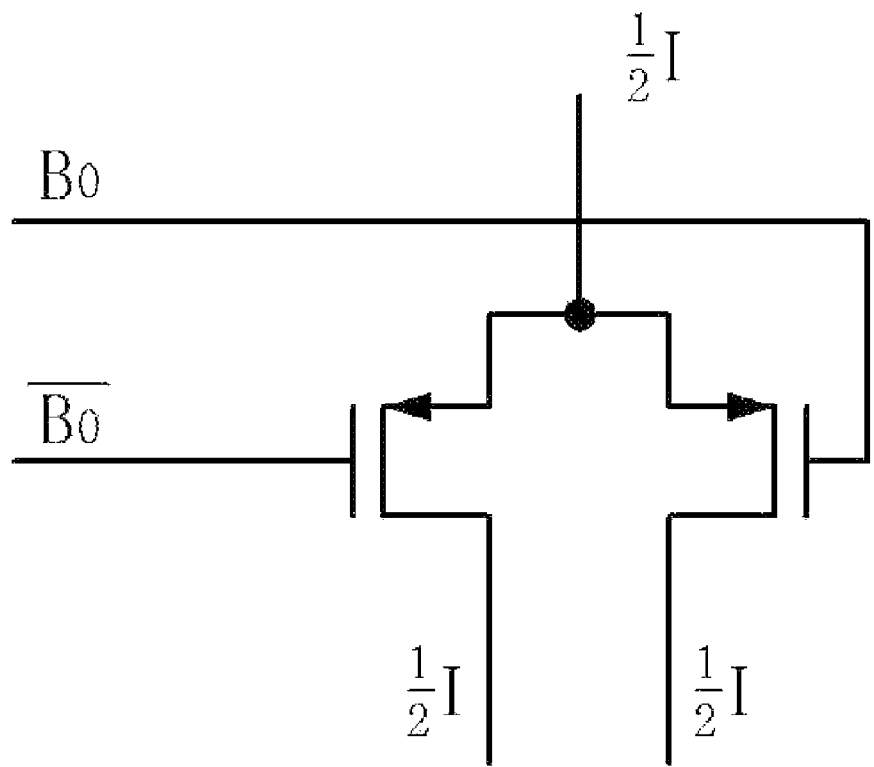
FIGS. 13 and 14 illustrate exemplary configurations of each unit switch illustrated in FIG. 12 according to an embodiment of the present invention.

As illustrated in FIG. 13, the switch 85 is configured with P-channel transistors.

Figure 14:
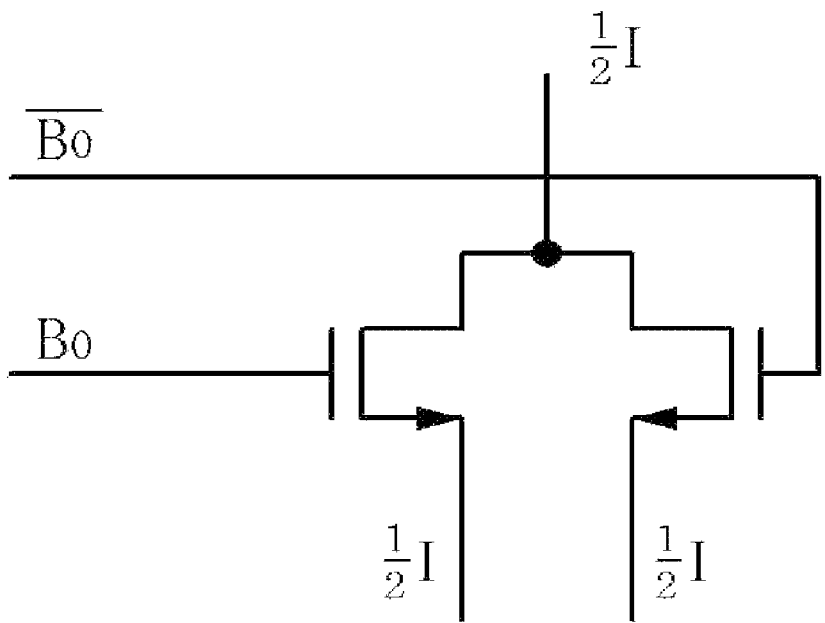

FIG. 14 illustrates another exemplary configuration of the switch 85 using N-channel transistors. Based on the illustrated configuration, a switching speed can be improved.

Figure 17:
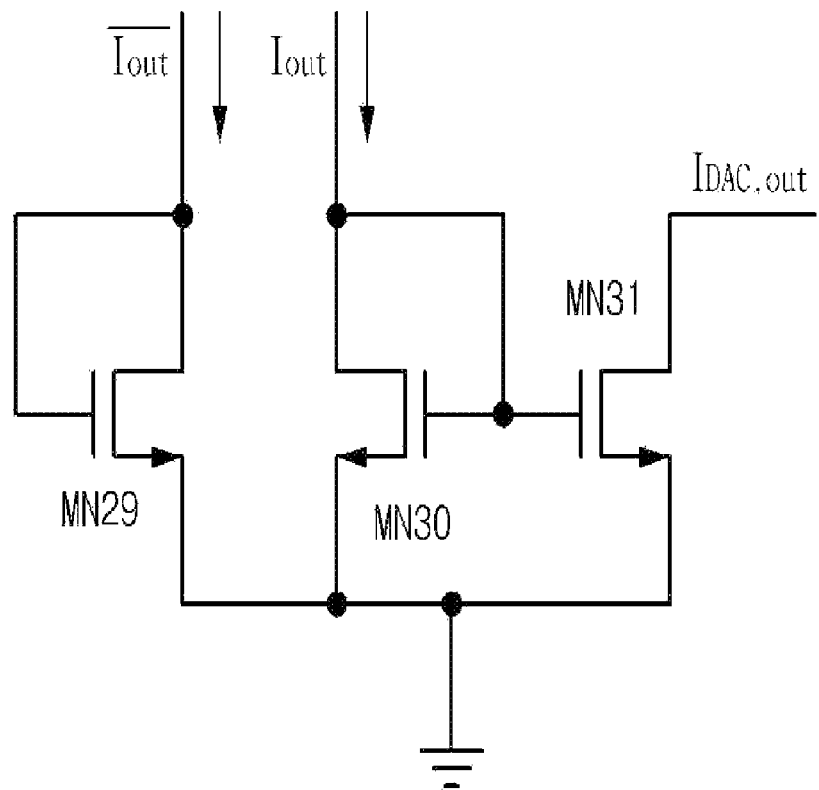
FIGS. 17 and 18 illustrate exemplary configurations of a current output block illustrated in FIG. 12 according to an embodiment of the present invention.
Figure 18:
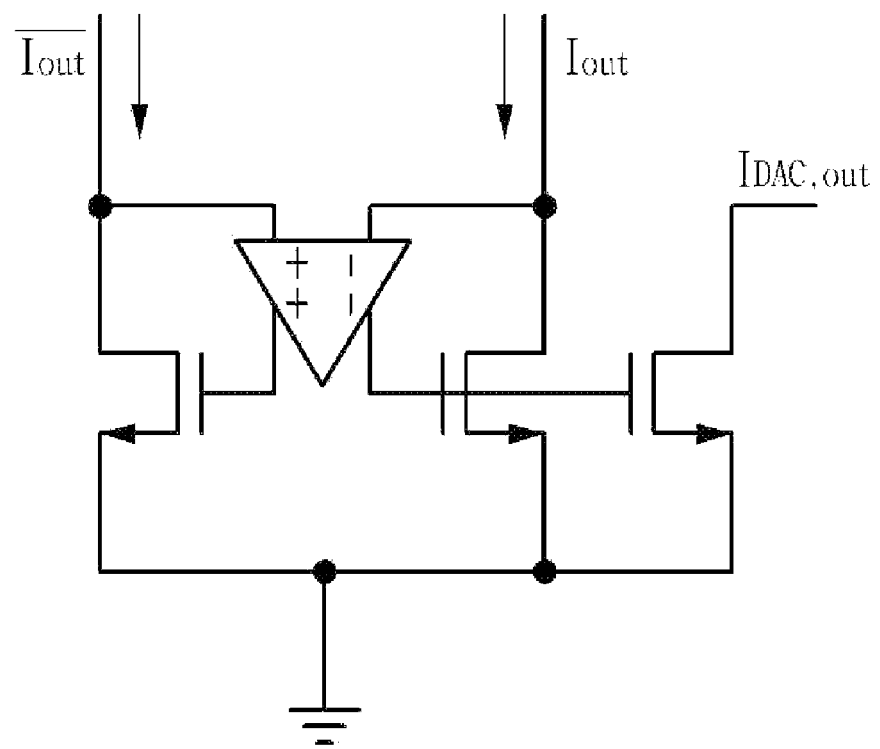
Figure 19:
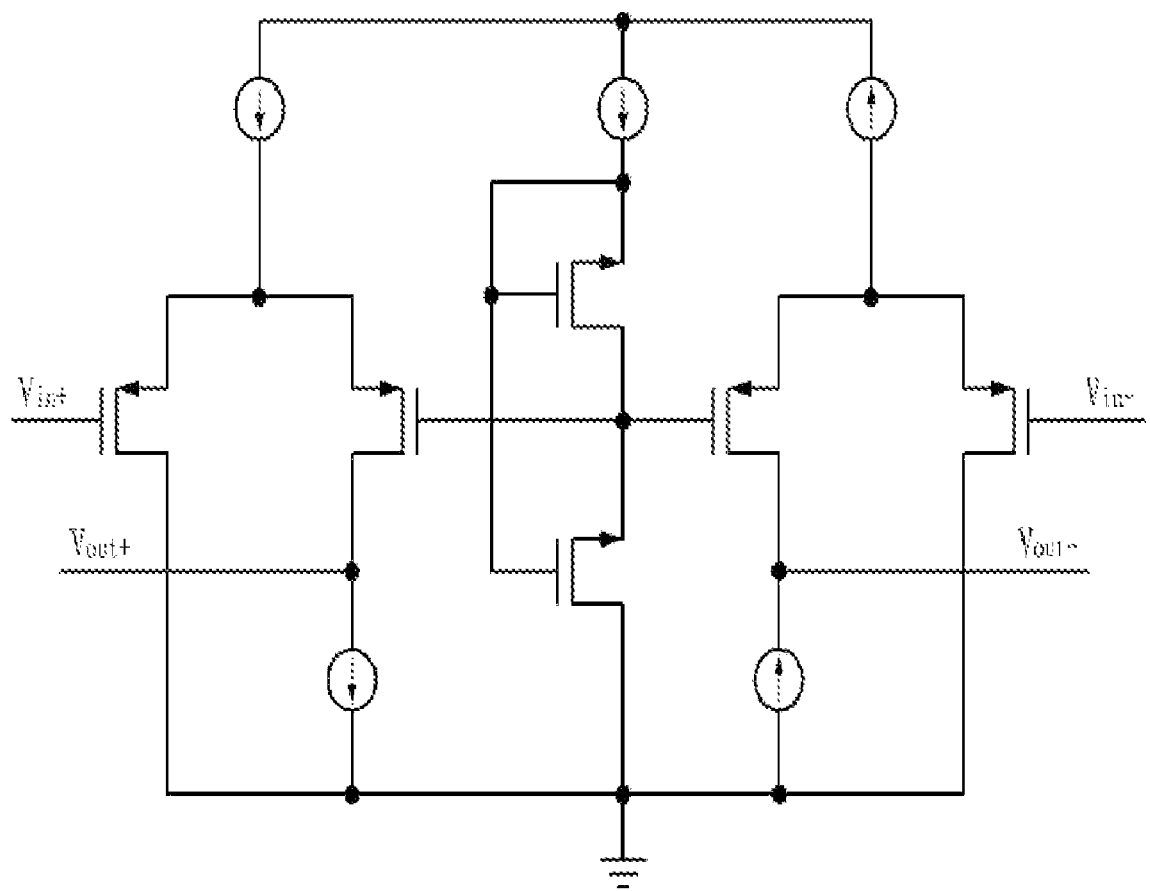
FIG. 19 illustrates a differential amplifier of the current output block illustrated in FIG. 18.

As illustrated in FIG. 17, the current output block 87 may be configured using a current mirror. However, the current output block 87 may also be configured to comprise a differential amplifier as illustrated in FIGS. 18 and 19. That is, using the differential amplifier allows minimization of an inter-terminal voltage between transistors that make up the current mirror illustrated in FIG. 18. The resultant redundant voltage obtained from the above inter-terminal voltage minimization can be divided and provided to other functional blocks stacked over each other, thereby allowing the DAC to operate at low voltage.

On the basis of various embodiments of the present invention, a high-resolution DAC can be provided.

The DAC can be implemented on a small chip area with a simplified circuit. In detail, since one current source is required for the DAC implementation, a digital circuit for controlling the current source can be simplified. Also, the DAC can be implemented on a small chip area because a size ratio of devices implemented for the DAC can be reduced.

Reducing sensitivity of a change in a characteristic to a change in a semiconductor fabrication process enhances operational stability of the DAC.

Although various embodiments/implementations of the present invention are described with reference to the accompanying drawings, it will be apparent for those skilled in the art that the technical configuration of the present invention can be embodied in various forms without modifying the scope and critical characteristics of the present invention.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. A digital-to-analog converter comprising:
   a current supplier;

a current divider dividing current supplied from the current supplier;

an inverter outputting inverted signals and non-inverted signals of input signals;

a switch controlling a flow of the divided current by the current divider according to the inverted signals and the non-inverted signals;

a current output block adding up the divided current according to the non-inverted signals to output an analog signal; and wherein the current divider comprises M number of unit current dividers, where M is a positive integer, the unit current dividers each comprising two N-channel transistors having commonly coupled source terminal and substantially the same channel size.

2. The digital-to-analog converter of claim 1, further comprising a bias block supplying a bias voltage to make the current divider operate at a saturation region.

3. The digital-to-analog converter of claim 1, wherein the current supplier is configured in a current mirror comprising one current source.

4. The digital-to-analog converter of claim 1, wherein drain terminal of one of the two N-channel transistors of the Lth unit current divider is commonly coupled to source terminal of the two N-channel transistors of the L+1th unit current divider, where L is a positive integer equal to or less than M−1.

5. The digital-to-analog converter of claim 1, wherein the switch comprises M number of unit switches controlling supply of M number of divided current outputted from the M number of the unit current dividers.

6. The digital-to-analog converter of claim 5, wherein the unit switches each comprising two N-channel transistors having commonly coupled source terminal, wherein one of the non-inverted signals is inputted to a gate of one of the two N-channel transistors and one of the inverted signals is inputted to a gate of the other N-channel transistor.

7. The digital-to-analog converter of claim 5, wherein the unit switches each comprising two P-channel transistors having commonly coupled drain terminal, wherein one of the non-inverted signals is inputted to a gate of one of the two P-channel transistors and one of the inverted signals is inputted to a gate of the other P-channel transistor.

8. The digital-to-analog converter of claim 5, further comprising an impedance buffer coupled between the current divider and the switch.

9. The digital-to-analog converter of claim 8, wherein the impedance buffer comprises M number of unit impedance buffers coupled between the M number of the unit current dividers and the M number of the unit switches, wherein the unit impedance buffers each comprise one N-channel transistor or two N-channel transistors cascode-connected.

10. A digital-to-analog converter comprising:
a current supplier:
a current divider dividing current supplied from the current supplier;
an inverter outputting inverted signals and non-inverted signals of input signals;
a switch controlling a flow of the divided current by the current divider according to the inverted signals and the non-inverted signals;
a current output block adding up the divided current according to the non-inverted signals to output an analog signal; and
wherein the current output block comprises: a current mirror adding up the divided current according to the non-inverted signals to output the analog signal; and a diode-connected transistor providing a current path of the divided current according to the inverted signals.

11. A digital-to-analog converter comprising:
a current supplier;
a current divider dividing current supplied from the current supplier;
an inverter outputting inverted signals and non-inverted signals of input signals;
a switch controlling a flow of the divided current by the current divider according to the inverted signals and the non-inverted signals;
a current output block adding up the divided current according to the inverted signal to output an analog signal; and
wherein the current divider comprises M number of unit current dividers, where M is a positive integer, the unit current dividers each comprising two P-channel transistors having commonly coupled source terminal and substantially the same channel size.

12. The digital-to-analog converter of claim 11, further comprising a bias block supplying a bias voltage to make the current divider operate at a saturation region.

13. The digital-to-analog converter of claim 11, wherein the current supplier is configured in a current mirror comprising one current source.

14. The digital-to-analog converter of claim 11, wherein drain terminal of one of the two P-channel transistors of the Lth unit current divider is commonly coupled to source terminal of the two P-channel transistors of the L+1th unit current divider, where L is a positive integer equal to or less than M−1.

15. The digital-to-analog converter of claim 11, wherein the switch comprises M number of unit switches controlling supply of M number of divided current outputted from the M number of the unit current dividers.

16. The digital-to-analog converter of claim 15, wherein the unit switches each comprising two P-channel transistors having commonly coupled source terminal, wherein one of the non-inverted signals is inputted to a gate of one of the two P-channel transistors and one of the inverted signals is inputted to a gate of the other P-channel transistor.

17. The digital-to-analog converter of claim 15, wherein the unit switches each comprising two N-channel transistors having commonly coupled drain terminal, wherein one of the non-inverted signals is inputted to a gate of one of the two N-channel transistors and one of the inverted signals is inputted to a gate of the other N-channel transistor.

18. The digital-to-analog converter of claim 15, further comprising an impedance buffer coupled between the current divider and the switch.

19. The digital-to-analog converter of claim 16, wherein the impedance buffer comprises M number of unit impedance buffers coupled respectively between the M number of the unit current dividers and the M number of the unit switches, wherein the unit impedance buffers each comprise one P-channel transistor or two P-channel transistors cascode-connected.

20. A digital-to-analog converter comprising:
a current supplier;
a current divider dividing current supplied from the current supplier;
an inverter outputting inverted signals and non-inverted signals of input signals;
a switch controlling a flow of the divided current by the current divider according to the inverted signals and the non-inverted signals;

a current output block adding up the divided current according to the inverted signal to output an analog signal and wherein the current output block comprises: a current mirror adding up the divided current according to the non-inverted signals to output the analog signal; and a diode-connected transistor providing a current path of the divided current according to the inverted signals.

* * * * *